(12) United States Patent
Goyal

(10) Patent No.: US 6,872,988 B1
(45) Date of Patent: Mar. 29, 2005

(54) SEMICONDUCTOR FILMS ON FLEXIBLE IRIDIUM SUBSTRATES

(75) Inventor: Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/808,815

(22) Filed: Mar. 23, 2004

(51) Int. Cl.[7] .................. H01L 31/072; H01L 31/109; H01L 31/0328; H01L 31/0312; H01L 29/12
(52) U.S. Cl. ..................... 257/190; 257/77; 257/43
(58) Field of Search ............................ 257/43, 77, 190

(56) References Cited

U.S. PATENT DOCUMENTS

| | | |
|---|---|---|
| 5,739,086 A | 4/1998 | Goyal et al. |
| 5,741,377 A | 4/1998 | Goyal et al. |
| 5,898,020 A | 4/1999 | Goyal et al. |
| 5,958,599 A | 9/1999 | Goyal et al. |
| 5,964,966 A | 10/1999 | Goyal et al. |
| 5,968,877 A | 10/1999 | Budai et al. |
| 5,972,847 A | 10/1999 | Feenstra et al. |
| 6,077,344 A | 6/2000 | Shoup et al. |
| 6,106,615 A | 8/2000 | Goyal et al. |
| 6,114,287 A | 9/2000 | Lee et al. |
| 6,150,034 A | 11/2000 | Paranthaman et al. |
| 6,156,376 A | 12/2000 | Paranthaman et al. |
| 6,159,610 A | 12/2000 | Paranthaman et al. |
| 6,180,570 B1 | 1/2001 | Goyal |
| 6,235,402 B1 | 5/2001 | Shoup et al. |
| 6,256,521 B1 | 7/2001 | Lee et al. |
| 6,261,704 B1 | 7/2001 | Paranthaman et al. |
| 6,270,908 B1 | 8/2001 | Williams et al. |
| 6,316,391 B1 | 11/2001 | Doi et al. |
| 6,331,199 B1 | 12/2001 | Goyal et al. |
| 6,375,768 B1 | 4/2002 | Goyal |
| 6,399,154 B1 | 6/2002 | Williams et al. |
| 6,440,211 B1 | 8/2002 | Beach et al. |
| 6,447,714 B1 | 9/2002 | Goyal et al. |
| 6,451,450 B1 | 9/2002 | Goyal et al. |
| 6,455,166 B1 | 9/2002 | Truchan |
| 6,468,591 B1 | 10/2002 | Paranthaman et al. |
| 6,486,100 B1 | 11/2002 | Lee et al. |
| 6,599,346 B2 | 7/2003 | Goyal et al. |
| 6,602,313 B2 | 8/2003 | Goyal et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,617,283 B2 | 9/2003 | Paranthaman et al. |
| 6,635,097 B2 | 10/2003 | Goyal et al. |
| 6,645,313 B2 | 11/2003 | Goyal et al. |
| 6,663,976 B2 | 12/2003 | Beach et al. |
| 6,670,308 B2 | 12/2003 | Goyal |
| 2003/0143438 A1 | 7/2003 | Norton et al. |

OTHER PUBLICATIONS

U.S. Appl. No. 10/189,678, Goyal, filed Jul. 3, 2002.
M. Schreck, et al., "Diamond nucleation on iridium buffer layers and subsequent textured growth: A route for the realization of single–crystal diamond flims", . . . Jan. 8, 2001, pp. 192–194, vol. 78, No. 2, Applied Physics Letters, Melville, NY.

*Primary Examiner*—Cuong Nguyen
(74) *Attorney, Agent, or Firm*—Joseph A. Marasco

(57) ABSTRACT

A laminate semiconductor article includes a flexible substrate, an optional biaxially textured oxide buffer system on the flexible substrate, a biaxially textured Ir-based buffer layer on the substrate or the buffer system, and an epitaxial layer of a semiconductor. Ir can serve as a substrate with an epitaxial layer of a semiconductor thereon.

19 Claims, 3 Drawing Sheets

SEMICONDUCTOR FILMS ON FLEXIBLE IRIDIUM SUBSTRATES

The United States Government has rights in this invention pursuant to contract no. DE-AC05-00OR22725 between the United States Department of Energy and UT-Battelle, LLC.

FIELD OF THE INVENTION

The present invention relates to semiconductor films, and more particularly to biaxially textured semiconductor films and flexible Ir-based support substrates therefor.

BACKGROUND OF THE INVENTION

Various electromagnetically useful materials have been applied epitaxially to biaxially textured support materials. An important class of substrates is known as rolling assisted, biaxially textured substrates (RABiTS). Biaxial texture in a substrate refers to situation when all the grains in a polycrystalline substrate are aligned within a certain angular range with respect to one another. A polycrystalline material having biaxial texture of sufficient quality for electromagnetic applications can be generally defined as being characterized by an x-ray diffraction phi scan peak of no more than 20° full-width-half-maximum (FWHM) and a omega-scan of 10° FWHM. The X-ray phi-scan and omega-scan measure the degree of in-plane and out-of-plane texture respectively. An example of biaxial texture is the cube texture with orientation {100}<100>, wherein the (100) crystallographic plane of all grains is parallel to the substrate surface and the [100] crystallographic direction is aligned along the substrate length. Other suitable definitions have also been set forth in varying terms.

It is helpful to review some of the prior work that the present invention builds upon. The entire disclosure of each of the following U.S. patents is incorporated herein by reference:

U.S. Pat. No. 5,739,086 issued on Apr. 14, 1998 to Goyal, et al.
U.S. Pat. No. 5,964,966 issued on Oct. 12, 1999 to Goyal, et al.
U.S. Pat. No. 5,968,877 issued on Oct. 19, 1999 to Budai, et al.
U.S. Pat. No. 5,972,847 issued on Oct. 26, 1999 to Feenstra, et al.
U.S. Pat. No. 6,077,344 issued on Jun. 20, 2000 to Shoup, et al.
U.S. Pat. No. 6,114,287 issued on Sep. 5, 2000 to Lee, et al.
U.S. Pat. No. 6,150,034 issued on Nov. 21, 2000 to Paranthaman, et al.
U.S. Pat. No. 6,159,610 issued on Dec. 12, 2000 to Paranthaman, et al.
U.S. Pat. No. 6,180,570 issued on Jan. 30, 2001 to Goyal.
U.S. Pat. No. 6,256,521 issued on Jul. 3, 2001 to Lee, et al.
U.S. Pat. No. 6,261,704 issued on Jul. 17, 2001 to Paranthaman, et al.
U.S. Pat. No. 6,270,908 issued on Aug. 7, 2001 to Williams, et al.
U.S. Pat. No. 6,331,199 issued on Dec. 18, 2001 to Goyal, et al.
U.S. Pat. No. 6,440,211 issued on Aug. 27, 2002 to Beach, et al.
U.S. Pat. No. 6,447,714 issued on Sep. 10, 2002 to Goyal, et al.
U.S. Pat. No. 6,451,450 issued on Sep. 17, 2002 to Goyal, et al.
U.S. Pat. No. 6,617,283 issued on Sep. 9, 2003 to Paranthaman, et al.
U.S. Pat. No. 6,645,313 issued on Nov. 11, 2003 to Goyal, et al.
U.S. Pat. No. 6,670,308 issued on Dec. 30, 2003 to Goyal.
U.S. Patent Application Publication No. 20030143438 published on Jul. 31, 2003 to Norton, et al.
U.S. patent application Ser. No. 10/324,883 filed on Dec. 19, 2002.
U.S. patent application Ser. No. 10/620,251 filed on Jul. 14, 2003.
U.S. Pat. No. 6,632,539 issued on Oct. 19, 2003 to Iijima et al.
U.S. Pat. No. 6,214,772 issued on Apr. 10, 2001 to Iijima et al.,
U.S. Pat. No. 5,650,378 issued on Jul. 22, 1997 to Iijima et al.
U.S. Pat. No. 5,872,080 issued on Feb. 19, 1999 to Arendt et al.
U.S. Pat. No. 6,190,752 issued on Feb. 20, 2001 to Do et al.
U.S. Pat. No. 6,265,353 issued on Jul. 24, 2001 to Kinder et al.
U.S. Pat. No. 5,432,151 issued on Jul. 11, 1995 to Russo et al.
U.S. Pat. No. 6,361,598 issued on Mar. 26, 2002 to Iijima et al.

Moreover, there are other known routes to fabrication of biaxially textured, flexible electromagnetic devices known as ion-beam-assisted deposition (IBAD) and inclined-substrate deposition (ISD). IBAD processes are described in U.S. Pat. Nos. 6,632,539, 6,214,772, 5,650,378, 5,872,080, 5,432,151 and 6,361,598; ISD processes are described in U.S. Pat. Nos. 6,190,752 and 6,265,353; all these patents are incorporated herein by reference. In the IBAD and ISD processes a flexible, polycrystalline, untextured substrate is used and then a biaxially textured layer is deposited on this substrate.

Semiconductor research and development efforts are often focused on increasing the speed of electronic devices. Ultimately, there are only two ways to increase the speed of transistor switches based on existing semiconductor technologies. The first is to reduce the size of the structures on the semiconductor, thereby obtaining smaller transistors that are closer together and use less power. The second is to use alternative semiconductor materials that inherently switch faster. For example, the band-gap effects associated with GaAs's 3:5 valance structure mean that these transistors switch approximately eight times faster and use one-tenth the power of their silicon counterparts. Use of SiC, cubic boron nitride (cBN) and diamond based devices would potentially even faster. Hence, successful fabrication of semiconductors other than Si using industrially scalable routes if of great interest.

It has recently been demonstrated that epitaxy of diamond films can be obtained on Ir surfaces. M. Schreck et al. have shown that single-crystal Ir films can be deposited by electron beam evaporation on rigid, single crystal $SrTiO_3$ surfaces. However, such a process is limited to substrate selections available—rigid single crystal ceramic substrates such as $SrTiO_3$. Such a process cannot be used to make continuous long lengths or wide area devices since it is limited to the size in which SrTiO3 single crystals can be fabricated. Moreover, SrTiO3 are not flexible. Flexible refers to the ability of the substrate to be bent slightly withour cracking.

OBJECTS OF THE INVENTION

Accordingly, objects of the present invention include the provision of biaxially textured semiconductor materials, especially diamond, and flexible support materials therefor. Further and other objects of the present invention will become apparent from the description contained herein.

SUMMARY OF THE INVENTION

In accordance with one aspect of the present invention, the foregoing and other objects are achieved by a laminated semiconductor article that includes a flexible substrate; a biaxially textured Ir-based buffer layer over the flexible substrate; and at least one epitaxial layer of a semiconductor over the Ir buffer layer.

In accordance with another aspect of the present invention, a laminated semiconductor article including a flexible substrate; a biaxially textured buffer system on the flexible substrate; an epitaxial Ir-based buffer layer on the buffer system; and at least one epitaxial layer of a semiconductor over the Ir buffer layer.

In accordance with a further aspect of the present invention, a laminated semiconductor article including a flexible Ir-based substrate; and at least one epitaxial layer of a semiconductor over the flexible Ir substrate.

For a better understanding of the present invention, together with other and further objects, advantages and capabilities thereof, reference is made to the following disclosure and appended claims in connection with the above-described drawings.

DETAILED DESCRIPTION OF THE INVENTION

The invention provides methods for the fabrication of sharply biaxially textured substrates of various materials and semiconductor films epitaxially deposited thereon. As used herein, the phrase "sharply biaxially textured" is defined herein to mean a texture that approaches the texture provided by a bulk single crystal. A bulk article which is sharply biaxially textured has a crystallographic orientation such that all the grains in the substrate are crystallographically aligned within 7° throughout the substrate, preferably within 5°, and more preferably within 3°.

The invention also provides a method for the fabrication of flexible and long, single grained semiconductors epitaxially deposited on tapes, and articles formed thereof. As used herein, the phrase "single grain" is defined herein to mean that the semiconductor formed is crystallographically like a bulk single crystal.

Table 1 shows some semiconductors and their physical properties such as Si, GaAs, SiC and cubic boron nitride (cBN). Of particular interest are unconventional semiconductors such as diamond.

TABLE I

| Properties | Diamond | Si | GaAs | SiC | cBN |
|---|---|---|---|---|---|
| Lattice constant (Ang) | 3.567 | 5.431 | 5.653 | 4.359 | 3.615 |
| Density ($g/cm^3$) | 3.52 | 2.42 | 5.32 | 3.16 | 3.48 |

TABLE I-continued

| Properties | Diamond | Si | GaAs | SiC | cBN |
|---|---|---|---|---|---|
| Thermal conductivity (W/cm-K) | $20-150_{max}$ | 1.5 | 0.5 | 4.9 | 13 |
| Dielectric constant | 5.68 | 11.7 | 10.9 | 9.7 | 7.1 |
| Refractive index | 2.41 | 3.44 | 3.75 | 2.48 | 2.12 |
| Bandgap (eV) | 5.47 | 1.11 | 1.43 | 2.23 | 6.6–8.0 |
| Mobility ($cm^2/V.s$) Electrical | 1800 | 1350 | 8600 | 1000 | 1500 |
| Hole | 1600 | 480 | 400 | 70 | 450 |
| Saturation Velocity ($10^7$ cm/s) | 2.7 | 1.0 | 2.0 | 2.7 | |
| Breakdown Field ($10^7$ V/cm) | 100 | 3 | 4 | 30 | |

Figure 1:
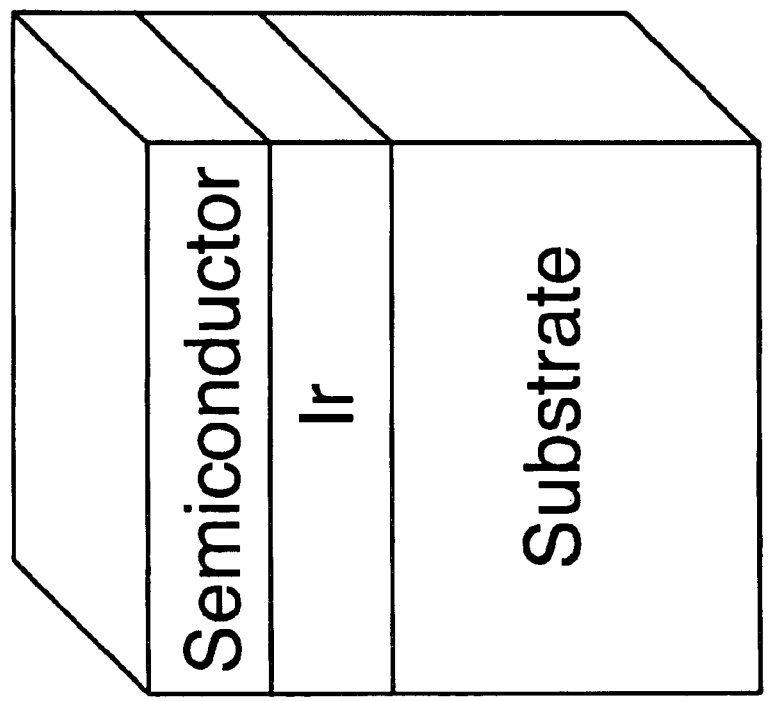

Ir or an Ir alloy can be used as a buffer layer on a substrate, or can serve as the substrate itself. It is critical to the invention that a single-crystal or biaxially textured semiconductor layer is above and in contact with a layer of single-crystal or biaxially textured Ir or Ir Alloy. Suitable Ir alloys include $Ir_{1-x}M_x$ wherein M comprises at least one element selected from the group consisting of Ta, Ti, Cu, Pt, Pd, Ru, Rh, Os, Au, W, and Ag. FIG. 1 shows one embodiment of the invention where a substrate supports a layer of single-crystal or biaxially textured Ir or Ir Alloy, upon which is deposited a semiconductor such as diamond.

Suitable substrates can have biaxially textured, substantially biaxially textured, single-grain or untextured surfaces. The substrate can be any suitable material that can support a biaxially textured buffer layer of Ir or its alloy. Suitable substrate materials include, but are not limited to stainless steel, Cu, Ni, Fe, Al, Ag, and alloys of any of the foregoing. Suitable alloying elements include, but are not limited to W, Cr, V, and Mn. Suitable substrate alloys include, but are not limited to Ni—W, Ni—Cr, Ni—Cr—W, Ni—Cr—V, Ni—V, and Ni—Mn. Suitable oxide substrates include, but are not limited to, MgO, $SrTiO_3$, and $REAlO_3$, where RE comprises at least one rare-earth element, namely Y, La, Ce, Pr, Nd, Pm, Sm, Eu, Gd, Th, Dy, Ho Er, Tm, Yb, and Lu. Substrate/Ir laminates can be prepared by any suitable method, including, but not limited to RABiTS, ion-beam assisted deposition (IBAD), and inclined-substrate deposition (ISD).

Figure 2:
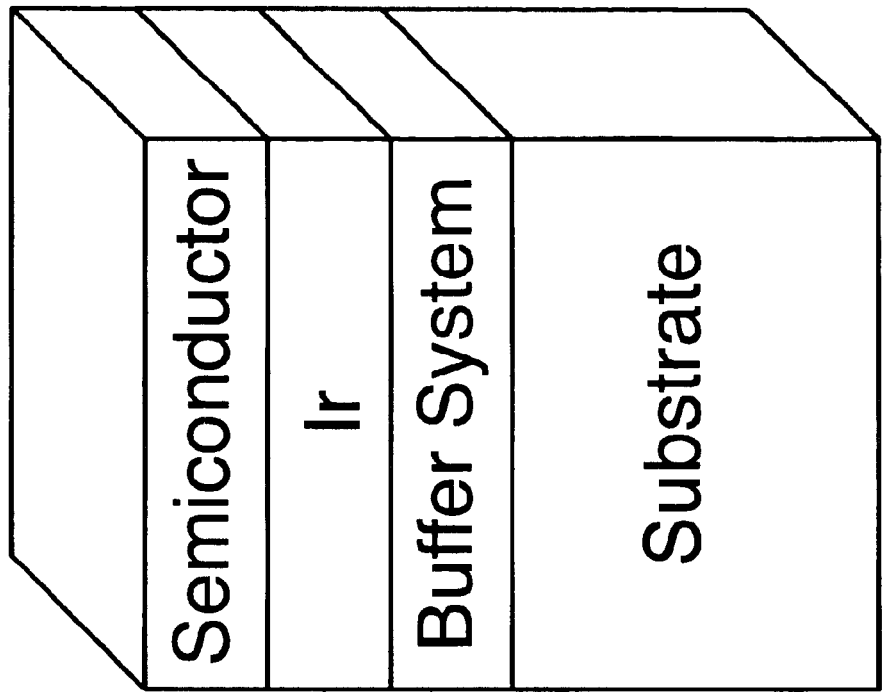
FIGS. 1–6 are schematic illustrations of various buffer layer architectures in accordance with the present invention.

One or more buffer layers can be deposited on the substrate, to form a buffer system between the substrate and the Ir layer. A buffer system generally comprises the layers between the substrate and the semiconductor layer. Buffer systems in accordance with the present invention can comprise any known architecture, and can be deposited by any known means, as long as there is a layer of biaxially textured Ir present above the buffer system. Some examples of suitable deposition methods include, but are not limited to: physical vapor deposition (PVD) which includes pulsed laser deposition (PLD), electron beam evaporation, sputtering (reactive, rf, dc, for example), etc.; chemical vapor deposition (CVD) which includes metal-organic CVD (MOCVD), sol-gel deposition, metal-organic deposition, spray pyrolysis, plasma spray, etc.; and plating methods such as elctrodeposition and electroless deposition. FIG. 2 shows biaxially textured buffer system between the substrate and the Ir.

Figure 3:
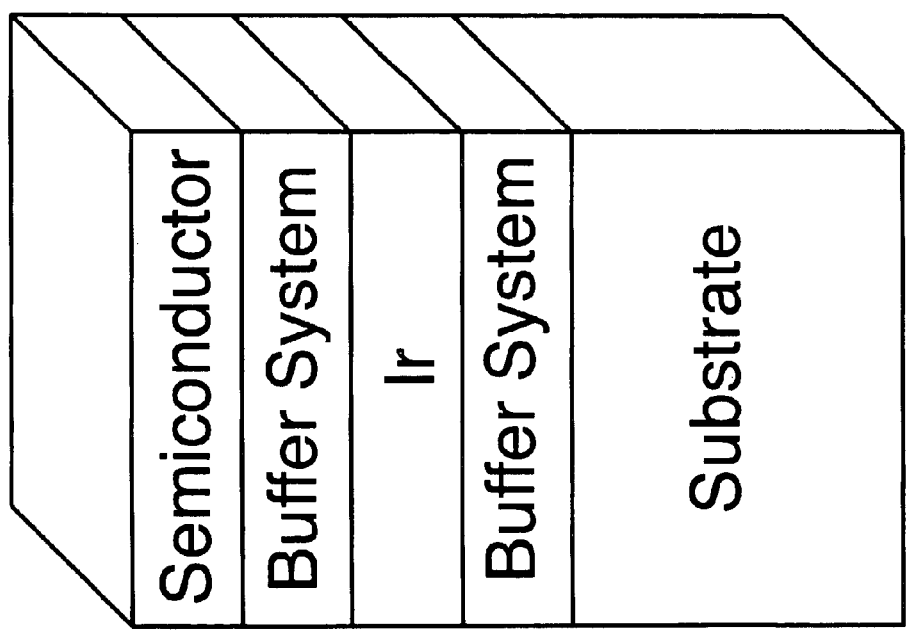

One or more buffer layers can be deposited on the substrate, to form a buffer system between the semiconductor and the Ir layer as well as a buffer between the substrate and the Ir layer. A buffer system generally comprises the layers between the substrate and the semiconductor layer. Buffer systems in accordance with the present invention can comprise any known architecture, and can be deposited by any known means, as long as there is a layer of biaxially textured Ir present above the buffer system. Some examples of suitable deposition methods include, but are not limited to: physical vapor deposition (PVD) which includes pulsed laser deposition (PLD), electron beam evaporation, sputtering (reactive, rf, dc, for example), etc.; chemical vapor deposition (CVD) which includes metal-organic CVD (MOCVD), sol-gel deposition, metal-organic deposition, spray pyrolysis, plasma spray, etc.; and plating methods such as elctrodeposition and electroless deposition. FIG. 3 shows two biaxially textured buffer systems—one between the substrate the Ir, and one between the Ir and the semiconductor.

Figure 4:
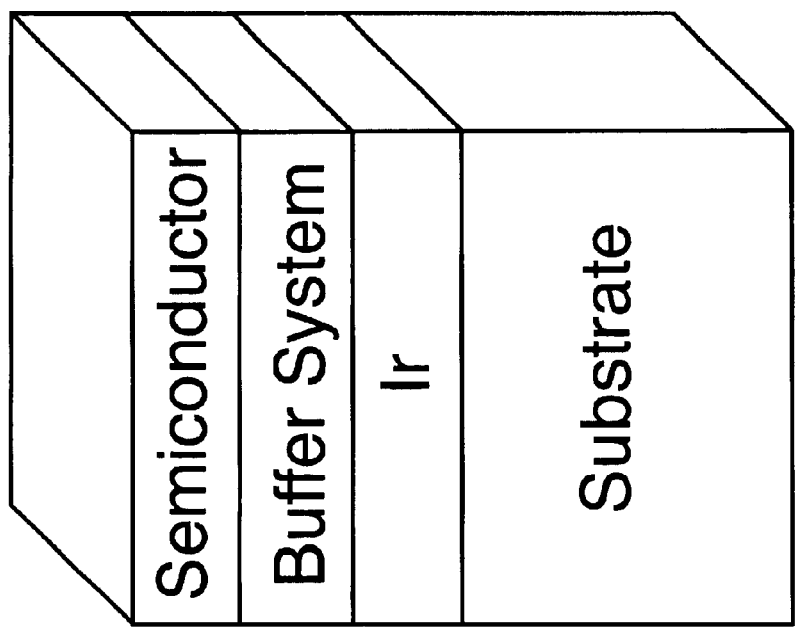

One or more buffer layers can also be deposited on the substrate, to form a buffer system between the Ir layer and the semiconductor. A buffer system generally comprises the layers between the substrate and the semiconductor layer. Buffer systems in accordance with the present invention can comprise any known architecture, and can be deposited by any known means, as long as there is a layer of biaxially textured Ir present above the buffer system. Some examples of suitable deposition methods include, but are not limited to: physical vapor deposition (PVD) which includes pulsed laser deposition (PLD), electron beam evaporation, sputtering (reactive, rf, dc, for example), etc.; chemical vapor deposition (CVD) which includes metal-organic CVD (MOCVD), sol-gel deposition, metal-organic deposition, spray pyrolysis, plasma spray, etc.; and plating methods such as elctrodeposition and electroless deposition. FIG. 4 shows one biaxially textured buffer system between the Ir layer and the semiconductor.

Figure 6:
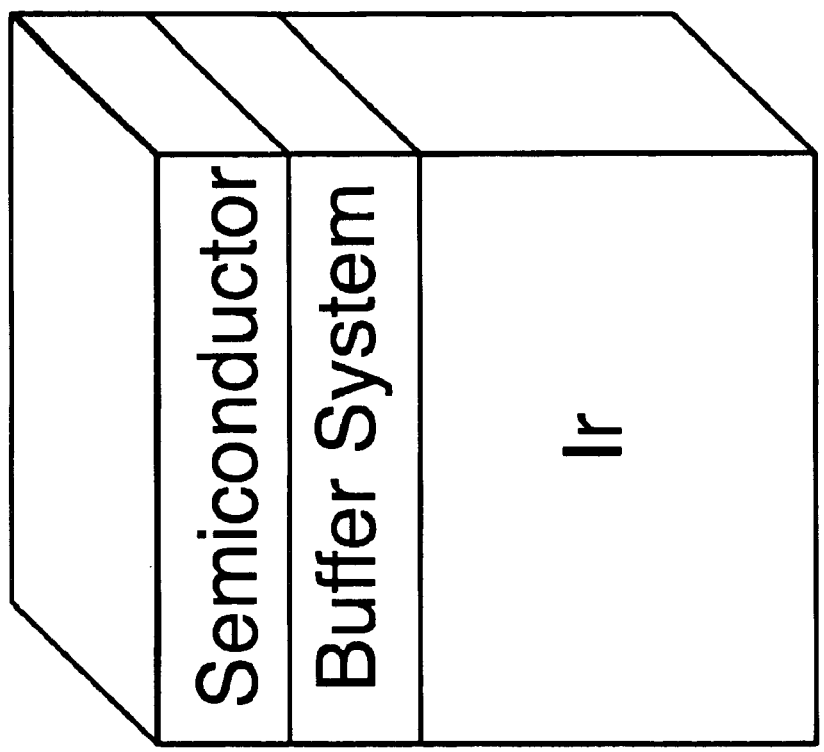
Figure 5:
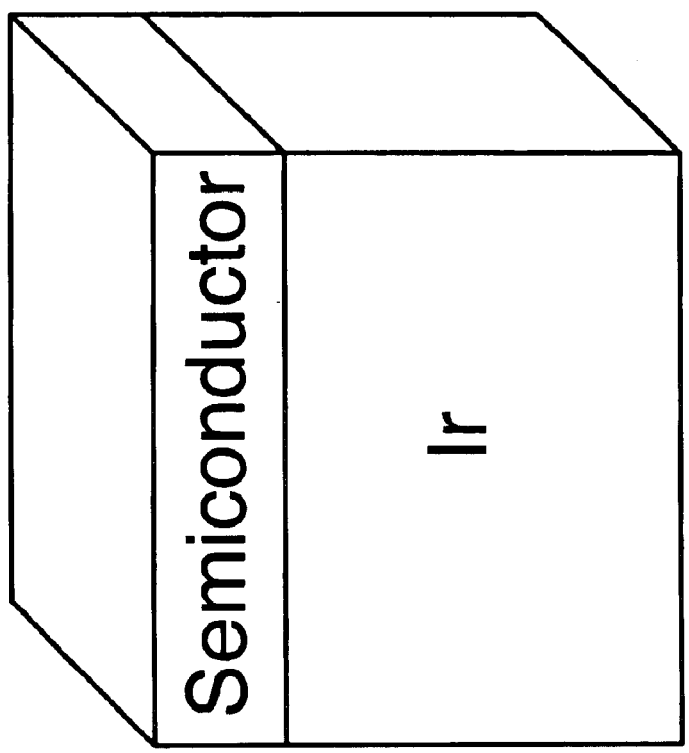

FIG. 5 shows a substrate of single-grain or biaxially textured Ir or Ir Alloy, upon which is deposited a semiconductor such as diamond. One or more buffer layers can also be deposited on the substrate, to form a buffer system between the semiconductor and the Ir-based single-grain substrate. A buffer system generally comprises the layers between the substrate and the semiconductor layer. Buffer systems in accordance with the present invention can comprise any known architecture, and can be deposited by any known means, as long as there is a layer of biaxially textured Ir present above the buffer system. Some examples of suitable deposition methods include, but are not limited to: physical vapor deposition (PVD) which includes pulsed laser deposition (PLD), electron beam evaporation, sputtering (reactive, rf, dc, for example), etc.; chemical vapor deposition (CVD) which includes metal-organic CVD (MOCVD), sol-gel deposition, metal-organic deposition, spray pyrolysis, plasma spray, etc.; and plating methods such as elctrodeposition and electroless deposition. FIG. 6 shows one biaxially textured buffer system between the Ir substrate and the semiconductor.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A laminated semiconductor article comprising:
   a. a flexible substrate;
   b. a biaxially textured Ir-based buffer layer over said flexible substrate; and
   c. at least one epitaxial layer of a semiconductor over said Ir buffer layer.

2. A laminated semiconductor article in accordance with claim 1 wherein at least a portion of said substrate comprises at least one of the group consisting of stainless steel, Cu, Ni, Fe, Al, Ag, and alloys of any of the foregoing.

3. A laminated semiconductor article in accordance with claim 1 wherein at least a portion of said substrate comprises at least one of the group consisting of Ni—W, Ni—Cr, Ni—Cr—W, Ni—Cr—Al, Ni—W—Al, Ni—Cr—V, Ni—V, and Ni—Mn.

4. A laminated semiconductor article in accordance with claim 1 wherein at least a portion of said article comprises a buffer system between the Ir-based buffer layer and said semiconductor, said buffer system comprising at least one material selected from the group consisting of nitrides, perovskites, MgO, $CeO_2$, $Y_2O_3$, $SrTiO_3$, $BaZrO_3$, $BaSnO_3$, $BaCeO_3$, YSZ, $(RE_{1-x}Sr_x)MnO_3$, $REMnO_3$, $RE_2O_3$, $REAlO_3$, $RE_2Zr_2O_7$, $RE_3NbO_7$, RESMO, and REMO where RE comprises at least one rare-earth element.

5. A laminated semiconductor article in accordance with claim 1 wherein at least a portion of said flexible substrate is characterized by at least one of the group of characteristics consisting of single crystal, biaxially textured, and untextured.

6. A laminated semiconductor article in accordance with claim 1 wherein said Ir buffer layer further comprises the alloy $Ir_{1-x}M_x$ wherein M comprises at least one element selected from the group consisting of Ta, Ti, Cu, Pt, Pd, Ru, Rh, Os, Au, W, and Ag.

7. A laminated semiconductor article in accordance with claim 1 wherein said semiconductor comprises diamond.

8. A laminated semiconductor article comprising:
   a. a flexible substrate;
   b. a biaxially textured buffer system on said flexible substrate;
   c. an epitaxial Ir-based buffer layer on said buffer system; and
   d. at least one epitaxial layer of a semiconductor over said Ir buffer layer.

9. A laminated semiconductor article in accordance with claim 8 wherein at least a portion of said substrate comprises at least one of the group consisting of stainless steel, Cu, Ni, Fe, Al, Ag, and alloys of any of the foregoing.

10. A laminated semiconductor article in accordance with claim 8 wherein at least a portion of said substrate comprises at least one of the group consisting of Ni—W, Ni—Cr, Ni—Cr—Al, Ni—W—Al, Ni—Cr—W, Ni—Cr—V, Ni—V, and Ni—Mn.

11. A laminated semiconductor article in accordance with claim 8 wherein at least a portion of said article comprises another buffer system between the Ir-based buffer layer and said semiconductor, said another buffer system comprising at least one material selected the group consisting of nitrides, perovskites, MgO, $CeO_2$, $Y_2O_3$, $SrTiO_3$, $BaZrO_3$, $BaSnO_3$, $BaCeO_3$, YSZ, $(RE_{1-x}Sr_x)MnO_3$, $REMnO_3$, $RE_2O_3$, $REAlO_3$, $RE_2Zr_2O_7$, $RE_3NbO_7$, RESMO, and REMO where RE comprises at least one rare-earth element.

12. A laminated semiconductor article in accordance with claim 8 wherein at least a portion of said flexible substrate is characterized by at least one of the group of characteristics consisting of single crystal, biaxially textured, and untextured.

13. A laminated semiconductor article in accordance with claim 8 wherein said oxide buffer system further comprises at least one material selected from the group consisting of perovskite, MgO, $CeO_2$, $Y_2O_3$, $SrTiO_3$, $BaZrO_3$, $BaSnO_3$, $BaCeO_3$, YSZ, $(RE_{1-x}Sr_x)MnO_3$, $REMnO_3$, $RE_2O_3$, $REAlO_3$, $RE_2Zr_2O_7$, $RE_3NbO_7$, RESMO, and REMO where RE comprises at least one rare-earth element.

14. A laminated semiconductor article in accordance with claim 8 wherein said Ir buffer layer further comprises the alloy $Ir_{1-x}M_x$ wherein M comprises at least one element selected from the group consisting of Ta, Ti, Cu, Pt, Pd, Ru, Rh, W, Os, Au, and Ag.

15. A laminated semiconductor article in accordance with claim 8 wherein said semiconductor comprises diamond.

16. A laminated semiconductor article comprising:
   a. a flexible Ir-based substrate; and
   b. at least one epitaxial layer of a semiconductor on said flexible Ir substrate.

17. A laminated semiconductor article in accordance with claim 16 wherein said flexible Ir substrate further comprises the alloy $Ir_{1-x}M_x$ wherein M comprises at least one element selected from the group consisting of Ta, Ti, Cu, Pt, Pd, Ru, Rh, Os, Au, and Ag.

18. A laminated semiconductor article in accordance with claim 16 wherein said semiconductor comprises diamond.

19. A laminated semiconductor article in accordance with claim 16 wherein said article further includes at least one buffer layer between the Ir-based layer and said semiconductor, said buffer layer comprising at least one material selected from the group consisting of nitrides, perovskites, MgO, $CeO_2$, $Y_2O_3$, $SrTiO_3$, $BaZrO_3$, $BaSnO_3$, $BaCeO_3$, YSZ, $(RE_{1-x}Sr_x)MnO_3$, $REMnO_3$, $RE_2O_3$, $REAlO_3$, $RE_2Zr_2O_7$, $RE_3NbO_7$, RESMO, and REMO where RE comprises at least one rare-earth element.

* * * * *